(12) United States Patent
Kim

(10) Patent No.: US 9,564,207 B2
(45) Date of Patent: Feb. 7, 2017

(54) SEMICONDUCTOR MEMORY DEVICE, SEMICONDUCTOR MEMORY SYSTEM AND METHOD FOR CONTROLLING SELF REFRESH CYCLE THEREOF

(71) Applicant: SK hynix Inc., Gyeonggi-do (KR)

(72) Inventor: Kwi-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/743,442

(22) Filed: Jun. 18, 2015

(65) Prior Publication Data

US 2016/0240240 A1 Aug. 18, 2016

(30) Foreign Application Priority Data

Feb. 13, 2015 (KR) .................. 10-2015-0022380

(51) Int. Cl.
*G11C 7/00* (2006.01)
*G11C 11/4096* (2006.01)
*G11C 11/406* (2006.01)
*G11C 11/4099* (2006.01)

(52) U.S. Cl.
CPC ........ *G11C 11/4096* (2013.01); *G11C 11/4099* (2013.01); *G11C 11/40611* (2013.01); *G11C 2211/4061* (2013.01)

(58) Field of Classification Search
CPC ............. G11C 11/406; G11C 11/40615; G11C 11/4074; G11C 7/1006; G11C 11/4076; G11C 2211/4067; G11C 7/1045; G11C 8/18; G11C 11/40622; G11C 11/408; G11C 11/4096; G11C 7/222; G11C 11/00; G11C 7/00; G11C 8/00

See application file for complete search history.

(56) References Cited

U.S. PATENT DOCUMENTS

| | | | | |
|---|---|---|---|---|
| 6,697,992 B2 * | 2/2004 | Ito | ................. | G06F 11/1008 360/47 |
| 6,834,020 B2 * | 12/2004 | Takahashi | ............ | G11C 11/406 365/189.09 |
| 7,075,847 B2 * | 7/2006 | Kim | ................. | G11C 11/40626 327/512 |
| 7,619,943 B2 * | 11/2009 | Kim | ........................ | G11C 7/04 365/201 |

FOREIGN PATENT DOCUMENTS

KR     1020050109501     11/2005

* cited by examiner

*Primary Examiner* — Hien Nguyen
(74) *Attorney, Agent, or Firm* — IP & T GROUP LLP

(57) ABSTRACT

A semiconductor memory device which performs a refresh operation. The semiconductor memory device may include an information detection unit suitable for detecting a refresh characteristic of a memory cell, a control signal generation unit suitable for generating a refresh control signal having a refresh cycle corresponding to the refresh characteristic, and a refresh driving unit suitable for driving a refresh operation on the memory cell with the refresh cycle in response to the refresh control signal.

15 Claims, 4 Drawing Sheets

SEMICONDUCTOR MEMORY DEVICE, SEMICONDUCTOR MEMORY SYSTEM AND METHOD FOR CONTROLLING SELF REFRESH CYCLE THEREOF

CROSS-REFERENCE TO RELATED APPLICATIONS

The present application claims priority of Korean Patent Application No. 10-2015-0022380, filed on Feb. 13, 2015, which is incorporated herein by reference in its entirety.

BACKGROUND

1. Field

Exemplary embodiments of the present invention relate to a semiconductor design technology and, more particularly, to a semiconductor memory device which performs a refresh operation.

2. Description of the Related Art

Semiconductor memory devices such as double data rate synchronous DRAM (DDR SDRAM) include memory banks for storing data. Each of memory banks includes tens of millions or more memory cells. Each of the memory cells includes a cell capacitor and a cell transistor. The semiconductor memory device stores data by charging and discharging the cell capacitor. The amount of charge stored should theoretically remain constant. However, in actuality, the charge stored in the cell capacitor changes due to voltage differences between the cell capacitor and peripheral circuits. That is, a charged capacitor may leak current or a discharged cell capacitor may gain a charge. A change in the amount of charge in the cell capacitor corresponds to a change in the data value of the memory cell, which means that the stored data may be lost. A semiconductor memory device performs a refresh operation in order to prevent this phenomenon from occurring. Refresh operations are already well known in the art and will not be described here in detail.

As process technology is developed, integration of semiconductor memory devices continues to increase. An increase in the degree of integration of semiconductor memory devices has played a pivotal role in reducing the size of memory banks. However, a reduction in the size of memory banks means that the interval between memory cells is reduced. As the interval between the memory cells is reduced, the possibility that adjacent memory cells may disturb each other increases. Accordingly, in recent years, attention has been focused on different methods for improving refresh operations.

SUMMARY

Various embodiments are directed to a semiconductor memory device capable of performing a refresh operation based on refresh characteristics, a semiconductor memory system, and an operation method of a semiconductor memory device.

In an embodiment, a semiconductor memory device may include an information detection unit suitable for detecting a refresh characteristic of a memory cell; a control signal generation unit suitable for generating a refresh control signal having a refresh cycle corresponding to the refresh characteristic; and a refresh driving unit suitable for driving a refresh operation on the memory cell with the refresh cycle in response to the refresh control signal.

The refresh characteristic of the memory cell may correspond to a time that is taken for data stored in the memory cell to be lost.

The memory cell may comprise a normal memory cell and a dummy memory cell, and the information detection unit may detect a refresh characteristic of the normal memory cell or dummy memory cell depending on an operation mode.

The operation mode may be defined by operation sections of a normal operation of the semiconductor memory device and a measure operation for detecting the refresh characteristic of the memory cell.

The operation mode may be defined based on whether the operation sections of the normal operation and the measure operation overlap.

The semiconductor memory device may further include a selection output unit suitable for outputting any data stored in the normal memory cell and the dummy memory cell to the information detection unit depending on the operation mode.

In an embodiment, an operation method of a semiconductor memory device may include: detecting a refresh characteristic of a memory cell; setting a refresh cycle based on the refresh characteristic; and performing a refresh operation with the refresh cycle.

The refresh characteristic of the memory cell may correspond to a time that is taken for data stored in the memory cell to be lost.

Detecting the refresh characteristic may include: performing a first operation for storing measure data in the memory cell; performing a second operation for outputting the measure data stored in the memory cell, after a scheduled measure time; comparing a value of the measure data stored in the memory cell with a value of the measure data output after the second operation; controlling the measure time based on a comparison result; and providing the controlled measure time as the refresh characteristic.

The measure time may be an interval between the first operation and the second operation.

The first operation may include a write operation and the second operation may include a read operation.

The first operation may include a refresh operation and the second operation may include a read operation.

In an embodiment, a semiconductor memory system may include: a semiconductor memory device comprising a memory cell; and a controller suitable for controlling a refresh cycle of a refresh operation of the semiconductor memory device based on a refresh characteristic of the memory cell.

The semiconductor memory device may comprise an information detection unit suitable for detecting the refresh characteristic of the memory cell.

The information detection unit may compare a value of data stored in the memory cell with a value of measure data output from the memory cell after a scheduled measure time, controls the measure time, and provides an output signal corresponding to the measure time to the controller.

The measure time may be a time taken for the data stored in the memory cell to be lost.

The memory cell may comprise a normal memory cell and a dummy memory cell, and the information detection unit detects a refresh characteristic of the normal memory cell or dummy memory cell depending on an operation mode.

The operation mode may be defined by operation sections of a normal operation of the semiconductor memory device and a measure operation for detecting the refresh characteristic of the memory cell.

The operation mode may be defined based on whether the operation sections of the normal operation and the measure operation overlap.

The semiconductor memory system may further include: a selection output unit suitable for outputting any data stored in the normal memory cell and the dummy memory cell to the information detection unit depending on the operation mode.

A semiconductor memory device accordance with an embodiment of the present invention is capable of detecting a refresh characteristic and controlling a refresh cycle of a refresh operation depending on the detected refresh characteristic.

DETAILED DESCRIPTION

Figure 1:
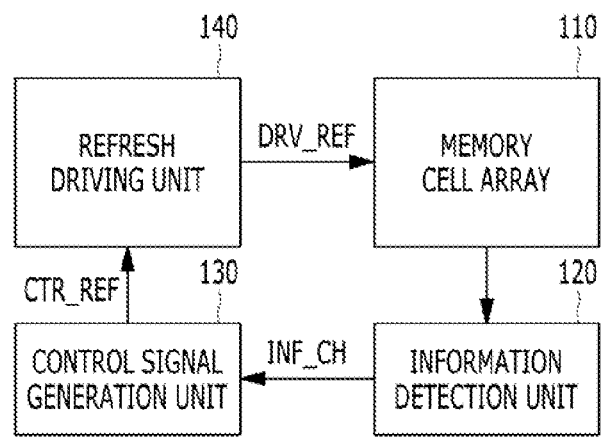
FIG. 1 is a block diagram illustrating a semiconductor memory device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned.

FIG. 1 is a block diagram illustrating a semiconductor memory device in accordance with an embodiment of the present invention.

Referring to FIG. 1, the semiconductor memory device may include a memory cell array 110, an information detection unit 120, a control signal generation unit 130, and a refresh driving unit 140.

The memory cell array 110 serves to store data and is an aggregate of memory cells. The semiconductor memory device receives data from outside (i.e. from a host or external device) and stores the data in the memory cells during a write operation, and outputs data stored in memory cells to the outside during a read operation. Furthermore, the semiconductor memory device performs a refresh operation so that data stored in a corresponding memory cell is not lost.

The information detection unit 120 detects refresh characteristics of the plurality of memory cells and generates refresh characteristic information INF_CH. The refresh characteristic may correspond to a time that is taken for data stored in a memory cell to be lost. The plurality of memory cells may have different refresh characteristics. A memory cell may have a better refresh characteristic than a specific criterion, and another memory cell may have a poorer refresh characteristic than the specific criterion. In a memory cell having the better refresh characteristic, a refresh operation may be performed with a longer period because the data stored in the memory cell is not lost as quickly. In contrast, in a memory cell having a poorer refresh characteristic, since a refresh operation needs to be performed with a shorter period, the refresh cycle is also shorter. Accordingly, the refresh characteristic information INF_CH may include information on the refresh cycle of the refresh operation on a corresponding memory cell.

The control signal generation unit 130 generates a refresh control signal CTR_REF having a refresh cycler corresponding to the refresh characteristic information INF_CH. The refresh control signal CTR_REF may have several types depending on a design option. For example, the refresh control signal CTR_REF may be enabled during the refresh cycle corresponding to the refresh characteristic information INF_CH. Alternatively, the refresh control signal CTR_REF may have information corresponding to the refresh cycle.

Furthermore the refresh driving unit 140 generates a refresh driving signal DRV_REF for driving the refresh operation on the memory cell array 110 in response to the refresh control signal CTR_REF.

A memory cell may include a cell capacitor configured to store data and a cell transistor disposed between a bit line and the cell capacitor and configured to connect the cell capacitor to the bit line. The cell transistor has a gate connected to a word line. The refresh driving signal DRV_REF may be used to drive the word line.

The semiconductor memory device in accordance with the embodiment of the present invention is able to detect a refresh characteristic of a memory cell and control a refresh cycle of a refresh operation based on a detection result.

Figure 2:
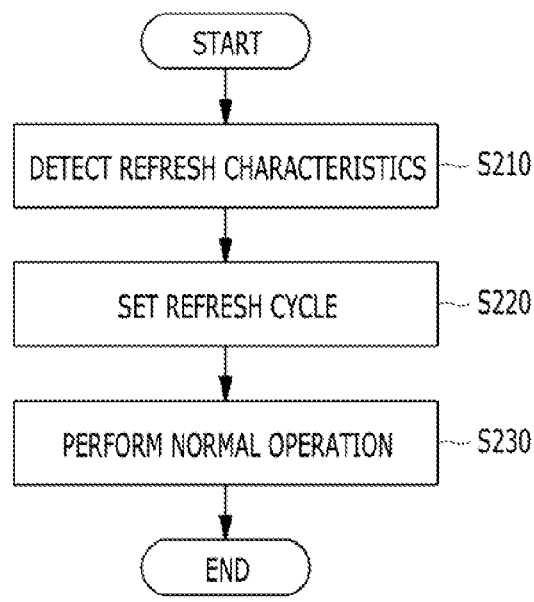
FIG. 2 is a flowchart illustrating an operation of the semiconductor memory device of FIG. 1.

FIG. 2 is a flowchart illustrating an operation of the semiconductor memory device of FIG. 1.

Referring to FIG. 2, the operation of the semiconductor memory device may include step S210 of detecting refresh characteristics, step S220 of setting a refresh cycle, and step S230 of performing a normal operation.

Hereinafter, referring to FIGS. 1 and 2, the operation of the semiconductor memory device will be described in detail.

At step S120, a refresh characteristic of a memory cell is detected. A refresh characteristic of a memory cell included in the memory cell array 110 is detected. Though there are various methods of detecting a refresh characteristic, this embodiment proposes a method of detecting a refresh characteristic by measuring a time during which data has been maintained after the data was stored in a memory cell. Accordingly, an operation for detecting a refresh characteristic is hereinafter called a "measure operation", for convenience of description. The measure operation is described in detail later with reference to FIG. 3.

At step S220, a refresh cycle is set. The refresh cycle of the refresh operation on the memory cell array 110 is set. As described with reference to FIG. 1, the information detection unit 120 detects the refresh characteristics of the memory cell through the measure operation, and generates the refresh characteristic information INF_CH. The control signal generation unit 130 generates the refresh control signal CTR_REF having the refresh cycle corresponding to the detected refresh characteristic information INF_CH. The refresh driving unit 140 generates the refresh driving signal DRV_REF in response to the refresh control signal CTR_REF. As a result, the refresh driving signal DRV_REF is generated based on the refresh characteristic information INF_CH. This means that the refresh cycle of the refresh operation is set based on the refresh characteristic of the memory cell.

At step S230, a normal operation is performed. When the normal operation is performed, the refresh driving unit 140 performs a refresh operation on the memory cell array 110 based on the refresh cycle set at step S220. In this case, the normal operation may include both a write operation and a read operation in addition to the refresh operation.

The semiconductor memory device in accordance with the embodiment of the present invention may detect a refresh characteristic of a memory cell through the measure operation, may control the refresh cycle of a refresh operation based on the detected refresh characteristic, and may perform the refresh operation with the controlled refresh cycle during a normal operation.

Figure 3:
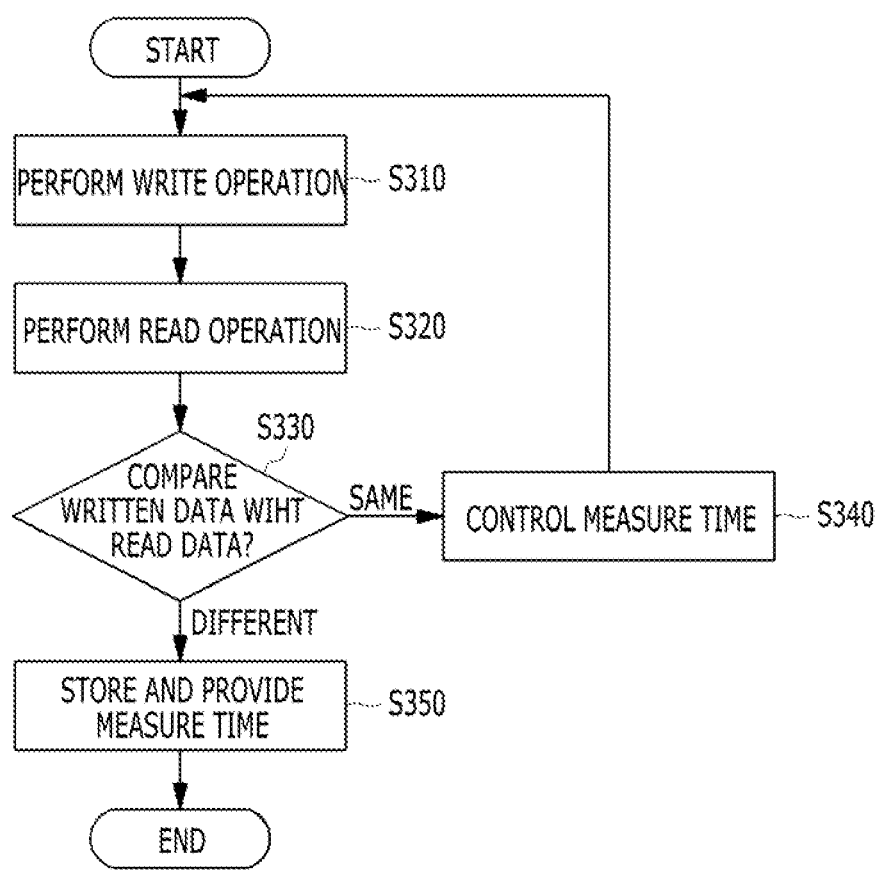
FIG. 3 is a flowchart illustrating a measure operation at step S210 of detecting refresh characteristics in FIG. 2.

FIG. 3 is a flowchart illustrating the measure operation at step S210 of detecting refresh characteristics in FIG. 2.

Referring to FIG. 3, step S210 of detecting refresh characteristics may include step S310 of performing a write operation, step S320 of performing a read operation, step S330 of comparing written data with read data, step S340 of controlling a measure time, and step S350 of storing and providing a measure time.

At step S310, a write operation for writing target data to be measured is performed on a corresponding memory cell. The target data is stored in the corresponding memory cell. At step S320, the target data stored in the corresponding memory cell is read after a scheduled time. That is, the target data stored in the corresponding memory cell is output. The scheduled time is the interval between step S310 and step S320. The interval is hereinafter called a "measure time" because it corresponds to a time taken for detecting a refresh characteristic. As will be described later, the measure time may be controlled at step S340 and stored at step S350.

At step S330, whether the data written at step S310 and the data read at step S320 have the same data value is determined by comparing the data written in step S310 with the data read at step S320. When the data are determined to have the same data value at step S330 (SAME), step S340 is performed. When the data are determined to have different data values from each other at step S330 (DIFFERENT), step S350 is performed. If the data values are the same, it means that the data written in the corresponding memory cell maintains the same data value even after the measure time elapses. If the data values are different, it means that the data written in the corresponding memory cell is lost after the measure time and thus the data values are different from each other.

At step S340, the measure time between step S310 and step S320 is controlled. If the data values are the same at step S330 (SAME), the measure time is increased and step S310 is performed. Steps S310, S320, S330, and S340 may be performed until the data values are different from each other at step S330 (DIFFERENT).

At step S350, the measure time is stored and provided. The measure time when the data values are different at step S330 is stored. At this time, if the measure time is long, it means that the time taken for the data stored in the memory cell to be lost is long. If the measure time is short, it means that the time taken for the data stored in the memory cell to be lost is short. As a result, if the measure time is long, it means a refresh characteristic is good. If the measure time is short, it means that a refresh characteristic is poor. The measure time stored at step S350 may be provided to the control signal generation unit 130 of FIG. 1 as the refresh characteristic information INF_CH, for example. The control signal generation unit 130 may control an activation cycle of the refresh control signal CTR_REF based on the measure time.

In this embodiment, in FIG. 3, step S310 of performing a write operation has been illustrated as being performed after step S340. In some embodiments, step S310 may be replaced with the execution of a refresh operation without an additional write operation at step S310.

The semiconductor memory device in accordance with the embodiment of the present invention may detect a measure time through a write operation and read operation and detect a refresh characteristic of a corresponding memory cell based on the measure time.

As described above, the semiconductor memory device includes a plurality of memory cells. Accordingly, the semiconductor memory device only has to set one memory cell to be representative during a measure operation, detect a refresh characteristic of the representative memory cell, and control the refresh cycles of the refresh operations of all the cells based on the detected refresh characteristic. The operation section of such a measure operation may be different from that of a normal operation. Such operation sections may overlap. A configuration and operation related to the operation sections of the normal operation and the measure operation are described below.

Figure 4:
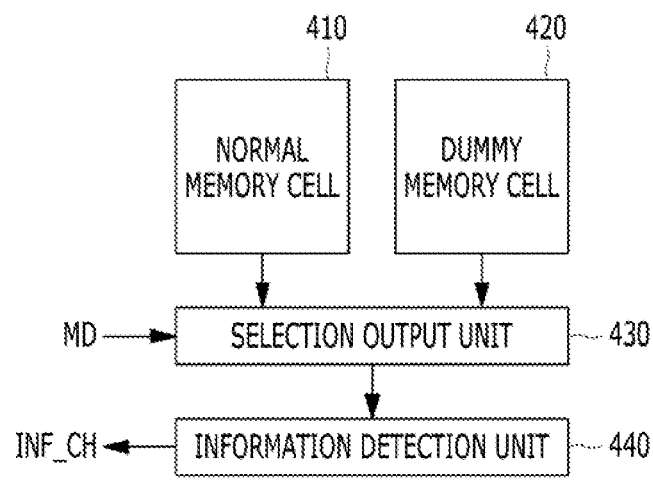
FIG. 4 is a block diagram illustrating a semiconductor memory device in accordance with another embodiment of the present invention.

FIG. 4 is a block diagram illustrating a semiconductor memory device in accordance with another embodiment of the present invention.

Referring to FIG. 4, the semiconductor memory device may include normal memory cells 410, dummy memory cells 420, a selection output unit 430, and an information detection unit 440.

The normal memory cells 410 include memory cells for storing data when a normal operation is performed. The dummy memory cells 420 include memory cells whose refresh characteristics are to be detected. The dummy memory cells 420 may be memory cells whose refresh characteristics are to be detected or redundancy memory cells for a repair operation. The selection output unit 430 outputs data stored in the normal memory cells 410 or data stored in the dummy memory cells 420 in response to an operation mode signal MD denoting one of first and second operation modes. In this case, the first and the second operation modes are divided depending on operation sections of the normal operation and a measure operation, as will be described later. Furthermore, the information detection unit 440 receives data output from the selection output unit 430, detects a refresh characteristic of a corresponding memory cell, and outputs the detected refresh characteristic as refresh characteristic information INF_CH.

The operation of the circuit is described in short below. The first operation mode means an operation mode in which the operation sections of the normal operation and the measure operation do not overlap. The second operation mode means an operation mode in which the operation sections of the normal operation and the measure operation overlap.

First, when a measure operation is performed in the first operation mode, the selection output unit 430 selectively outputs data output from the normal memory cells 410. The output data is referred to as a "measure data", for convenience. The information detection unit 440 detects refresh characteristics of the normal memory cells 410 based on the measure data. As a result, during the measure operation in the first operation mode, the semiconductor memory device may detect the refresh characteristics of the normal memory cells 410 and output the detected refresh characteristics as the refresh characteristic information INF_CH.

In the embodiment, data stored in the normal memory cells 410 has been illustrated as being used as measure data. In the first operation mode, however, the operation sections of the normal operation and the measure operation have been illustrated as not overlapping. Accordingly, in another embodiment, when the measure operation is performed in the first operation mode, any data stored in the normal memory cells 410 and data stored in the dummy memory cells 420 may be used as the measure data.

When a measure operation in the second operation mode is performed, the selection output unit 430 outputs data output from the dummy memory cells 420, as measure data. The information detection unit 440 detects refresh characteristics of the dummy memory cells 420 based on the measure data. As a result, during the measure operation in the second operation mode, the semiconductor memory device may detect the refresh characteristics of the dummy memory cells 420 and output the detected refresh characteristics as the refresh characteristic information INF_CH.

As described above, the dummy memory cells 420 may be the memory cells whose refresh characteristics are to be detected or the redundancy memory cells for the repair operation. That is, the dummy memory cells 420 only have to be memory cells driven separately from the normal operation.

The semiconductor memory device in accordance with the embodiment of the present invention may detect a refresh characteristic of a corresponding memory cell depending on a normal operation and a measure mode.

Figure 5:
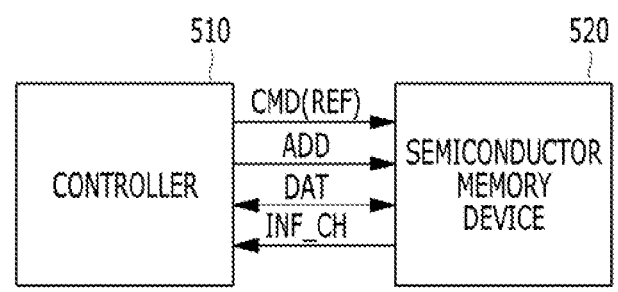
FIG. 5 is a block diagram illustrating a semiconductor memory system in accordance with an embodiment of the present invention.

FIG. 5 is a block diagram illustrating a semiconductor memory system in accordance with an embodiment of the present invention.

Referring to FIG. 5, the semiconductor memory system may include a controller 510 and a semiconductor memory device 520.

The controller 510 serves to control the semiconductor memory device 520. The controller 510 and the semiconductor memory device 520 exchange various signals. For example, the controller 510 may control write operations and read operations of the semiconductor memory device 520. In this case, the controller 510 and the semiconductor memory device 520 may send or receive a command CMD, an address ADD, and data DAT.

The controller 510 receives refresh characteristic information INF_CH from the semiconductor memory device 520 and controls when a refresh command REF is enabled. The refresh command REF may be included in the command CMD. To control when the refresh command REF is enabled is to control the refresh cycle of a refresh operation. As a result, this means that the controller 510 controls the refresh cycle of the refresh operation of the semiconductor memory device 520 based on the refresh characteristic information INF_CH.

The semiconductor memory device 520 performs a refresh operation based on the refresh command REF and may include the information detection unit 120 of FIG. 1 in addition to the memory cell array 110 of FIG. 1.

Figure 6:
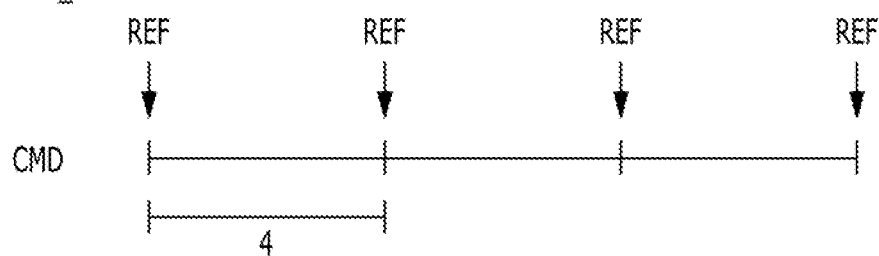
FIG. 6 is a timing diagram illustrating an operation of the semiconductor memory system of FIG. 5.
Figure 6:
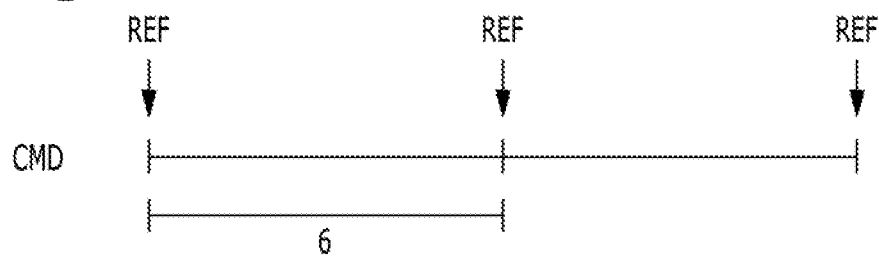
Figure 6:

FIG. 6 is a timing diagram illustrating an operation of the semiconductor memory system of FIG. 5.

Referring to FIG. 6, when the refresh command REF is enabled based on the refresh characteristic information INF_CH is illustrated. An example where the refresh characteristic information INF_CH is "4" and an example where the refresh characteristic information INF_CH is "6" will be described. The example where the refresh characteristic information INF_CH is "4" means that the aforementioned measure time is "4." This means that the time taken for the data stored in the memory cell to be lost is "4." If the example where the refresh characteristic information INF_CH is "4" is compared with the example where the refresh characteristic information INF_CH is "6", the example where the refresh characteristic information INF_CH is "4" illustrates that the time taken for the data stored in the memory cell to be lost is shorter than the example where the refresh characteristic information INF_CH is "6." Accordingly, the example where the refresh characteristic information INF_CH is "4" has a poorer refresh characteristic than the example where the refresh characteristic information INF_CH is "6."

First, when the refresh characteristic information INF_CH is "4" (①), the refresh command REF may be input with a refresh cycle corresponding to "4." When the refresh characteristic information INF_CH is "6" (②), the refresh command REF may be input with a refresh cycle corresponding to "6." As may be seen from FIG. 6, the refresh command REF is enabled four times in a scheduled section T in example ①, whereas the refresh command REF is enabled three times in a scheduled section T in example ②. As a result, the controller 510 of FIG. 5 may control when the refresh command REF is enabled based on the refresh characteristic information INF_CH.

The semiconductor memory system in accordance with the embodiment of the present invention may control the refresh cycle of the refresh operation of the semiconductor memory device based on the refresh characteristic information INF_CH supplied from the semiconductor memory device.

For reference, a write command or read command may be enabled between a section in which a refresh command REF is enabled and a section in which a next refresh command REF is enabled. This means that the controller 510 (refer to FIG. 5) may tightly control the semiconductor memory device 520.

As described above, the semiconductor memory device in accordance with the embodiment of the present invention may detect a refresh characteristic of a memory cell and control a refresh cycle of a refresh operation based on the detected refresh characteristic. Accordingly, the semiconductor memory device may perform refresh operations as little as possible based on measuring the refresh characteristics of the memory cells. As a result, the overall operation performance of the semiconductor memory device may be improved.

Furthermore, there are advantages in that unnecessary power consumption and unnecessary circuit operations may be minimized through an optimized refresh operation.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
an information detection unit suitable for detecting a refresh characteristic of a memory cell depending on an operation mode, wherein the memory cell comprises a normal memory cell and a dummy memory cell;
a control signal generation unit suitable for generating a refresh control signal having a refresh cycle corresponding to the refresh characteristic; and
a refresh driving unit suitable for driving a refresh operation on the memory cell with the refresh cycle in response to the refresh control signal,
wherein the operation mode is defined by operation sections of a normal operation of the semiconductor memory device and a measure operation for detecting the refresh characteristic of the memory cell.

2. The semiconductor memory device of claim 1, wherein the refresh characteristic of the memory cell corresponds to a time that is taken for data stored in the memory cell to be lost.

3. The semiconductor memory device of claim 1, wherein the operation mode is defined based on whether the operation sections of the normal operation and the measure operation overlap.

4. The semiconductor memory device of claim 1, further comprising:
a selection output unit suitable for outputting any data stored in the normal memory cell and the dummy memory cell to the information detection unit depending on the operation mode.

5. An operation method of a semiconductor memory device, comprising:
detecting a refresh characteristic of a memory cell;
setting a refresh cycle based on the refresh characteristic; and
performing a refresh operation with the refresh cycle,
wherein the detecting the refresh characteristic comprises:
performing a first operation for storing measure data in the memory cell;
performing a second operation for outputting the measure data stored in the memory cell, after a scheduled measure time;
comparing a value of the measure data stored in the memory cell with a value of the measure data output after the second operation;
controlling the measure time based on a comparison result; and
providing the controlled measure time as the refresh characteristic.

6. The operation method of claim 5, wherein the refresh characteristic of the memory cell corresponds to a time that is taken for data stored in the memory cell to be lost.

7. The operation method of claim 5, wherein the measure time is an interval between the first operation and the second operation.

8. The operation method of claim 5, wherein the first operation comprises a write operation and the second operation comprises a read operation.

9. The operation method of claim 5, wherein the first operation comprises a refresh operation and the second operation comprises a read operation.

10. A semiconductor memory system comprising:
a semiconductor memory device comprising a memory cell; and
a controller suitable for controlling a refresh cycle of a refresh operation of the semiconductor memory device based on a refresh characteristic of the memory cell,
wherein the semiconductor memory device comprises an information detection unit suitable for detecting the refresh characteristic of the memory cell,
wherein the information detection unit compares a value of data stored in the memory cell with a value of measure data output from the memory cell after a scheduled measure time, controls the measure time, and provides an output signal corresponding to the measure time to the controller.

11. The semiconductor memory system of claim 10, wherein the measure time is a time taken for the data stored in the memory cell to be lost.

12. The semiconductor memory system of claim 10, wherein:
the memory cell comprises a normal memory cell and a dummy memory cell, and
the information detection unit detects a refresh characteristic of the normal memory cell or dummy memory cell depending on an operation mode.

13. The semiconductor memory system of claim 12, wherein the operation mode is defined by operation sections of a normal operation of the semiconductor memory device and a measure operation for detecting the refresh characteristic of the memory cell.

14. The semiconductor memory system of claim 13, wherein the operation mode is defined based on whether the operation sections of the normal operation and the measure operation overlap.

15. The semiconductor memory system of claim 12, further comprising:
a selection output unit suitable for outputting any data stored in the normal memory cell and the dummy memory cell to the information detection unit depending on the operation mode.

* * * * *